(12) United States Patent
Chen

(10) Patent No.: US 6,437,448 B1
(45) Date of Patent: Aug. 20, 2002

(54) SEMICONDUCTOR DEVICE ADAPTED FOR MOUNTING ON A SUBSTRATE

(76) Inventor: I-Ming Chen, No. 60, Lane 328, Li-Shan St., Nei-Hu Dist., Taipei City (TW)

( * ) Notice: Subject to any disclaimer, the term of this patent is extended or adjusted under 35 U.S.C. 154(b) by 0 days.

(21) Appl. No.: 09/765,793

(22) Filed: Jan. 18, 2001

Related U.S. Application Data

(63) Continuation-in-part of application No. 09/725,431, filed on Nov. 29, 2000.

(30) Foreign Application Priority Data

Oct. 21, 2000 (TW) .......................... 89100578 A

(51) Int. Cl.$^7$ .......................... H01L 23/48; H01L 23/52; H01L 29/40
(52) U.S. Cl. .......................... 257/777; 257/737
(58) Field of Search ................. 257/737, 738, 257/777, 778, 779, 780, 781, 782, 784, 787

(56) References Cited

U.S. PATENT DOCUMENTS

| | | | |
|---|---|---|---|
| 5,222,014 A | * | 6/1993 | Lin .......................... 361/414 |
| 5,990,546 A | * | 11/1999 | Igarashi et al. .............. 257/700 |
| 6,143,991 A | * | 11/2000 | Moriyama ................... 174/261 |
| 6,200,143 B1 | * | 3/2001 | Haba et al. .................... 439/70 |
| 6,239,488 B1 | * | 5/2001 | Chen .......................... 257/737 |

* cited by examiner

Primary Examiner—Viet Q. Nguyen
Assistant Examiner—David Nhu
(74) Attorney, Agent, or Firm—Christensen O'Connor; Johnson Kindness PLLC

(57) ABSTRACT

A method for manufacturing a semiconductor device includes the steps of providing a semiconductor chip having a pad-mounting surface with a bonding pad, forming a first bump on the bonding pad, forming a photoresist layer on the pad-mounting surface, forming a second bump which protrudes from the first bump through an upper surface of the photoresist layer, and forming a conductive body on the second bump. The conductive body has an anchor portion connecting electrically with and encapsulating an upper portion of the second bump, and a contact portion offset from the anchor portion and adapted to be connected to a substrate.

11 Claims, 4 Drawing Sheets

SEMICONDUCTOR DEVICE ADAPTED FOR MOUNTING ON A SUBSTRATE

This application is a continuation-in-part (CIP) of co-pending U.S. patent application Ser. No. 09/725,431, filed by the applicant on Nov. 29, 2000, the entire disclosure of which is incorporated herein by reference.

BACKGROUND OF THE INVENTION

1. Field of the Invention

This invention relates to a method for mounting a semiconductor chip on a substrate and to a semiconductor device that is adapted for mounting on a substrate.

2. Description of the Related Art

With the rapid advancement in semiconductor fabrication technology, the bonding pads on the surface of a semiconductor chip are getting smaller in size, and the distance between adjacent bonding pads are getting shorter. These can create difficulty when connecting the semiconductor chip to an external circuit, and can affect adversely the production yield.

In the co-pending U.S. patent application Ser. No. 09/725,431, the applicant disclosed a method for mounting a semiconductor chip on a substrate to prepare a semiconductor device. The substrate has a chip-mounting region provided with a plurality of solder points. The semiconductor chip has a pad-mounting surface provided with a plurality of bonding pads, which are to be connected to corresponding ones of the solder points and which are disposed on the pad-mounting surface at locations that are offset from locations of the corresponding ones of the solder points on the chip-mounting region. The method involves the steps of: forming a plurality of conductive bumps, each of which is electrically connected to and is formed so as to protrude from a respective one of the bonding pads; forming a photoresist layer on the pad-mounting surface with a plurality of access holes, each of which is registered with and exposes at least a portion of one of the bumps; and forming a plurality of conductive bodies, each of which has an anchor portion filling one of the access holes and connected to and encapsulating the exposed portion of the respective one of the bumps, an extension portion extending from the anchor portion and formed on the surface of the photoresist layer, and a contact portion protruding from one end of the extension portion and formed on the surface of the photoresist layer opposite to the anchor portion. The contact portion is disposed at the position corresponding to a respective one of the solder points on the chip-mounting region of the substrate.

SUMMARY OF THE INVENTION

An object of the present invention is to provide a semiconductor device of the type disclosed in the aforesaid co-pending U.S. patent application Ser. No. 09/725,431 that is capable of overcoming the aforesaid drawback.

According to the present invention, a semiconductor device is adapted for mounting on a substrate having a chip-mounting region provided with a plurality of solder points. The semiconductor device comprises: a semiconductor chip having a pad-mounting surface provided with a plurality of bonding pads which are disposed on the pad-mounting surface; a plurality of conductive first bumps electrically and respectively connected to and protruding from the bonding pads; a photoresist layer formed on the pad-mounting surface of the semiconductor chip, the photoresist layer being formed with a plurality of access holes registered with and exposing at least a portion of a respective one of the first bumps on the bonding pads; and a plurality of conductive second bumps, each of which has a lower portion filling a respective one of the access holes to electrically connect with and encapsulate the portion of a respective one of the first bumps, and an upper portion extending from the lower portion and protruding from an upper surface of the photoresist layer opposite to the pad-mounting surface.

According to a further aspect of the present invention, a semiconductor device is adapted for mounting on a substrate having a chip-mounting region provided with a plurality of solder points. The semiconductor device comprises: a semiconductor chip having a pad-mounting surface provided with a plurality of bonding pads; a photoresist layer formed on the pad-mounting surface of the semiconductor chip, the photoresist layer being formed with a plurality of access holes registered with and exposing at least a portion of a respective one of the bonding pads, each of the access holes being confined by a peripheral wall; a plurality of plating layers, each of which has a tubular lower portion that lines the peripheral wall of a respective one of the access holes and that is electrically connected to a respective one of the bonding pads, and an upper portion that lies on an upper surface of the photoresist layer around the respective one of the access holes; and a plurality of conductive bodies, each of which has an extension portion, and an anchor portion and a contact portion on opposite ends of the extension portion, the anchor portion filling an interior of the lower portion of a respective one of the plating layers, and encapsulating the upper portion of the respective one of the plating layers so as to connect electrically with the respective one of the bonding pads, the contact portion being formed on the upper surface of the photoresist layer and being disposed at the location corresponding to a respective one of the solder points on the chip-mounting region of the substrate, the extension portion being formed on the upper surface of the photoresist layer and interconnecting the anchor and contact portions.

BRIEF DESCRIPTION OF THE DRAWINGS

In drawings which illustrate embodiments of the invention.

DETAILED DESCRIPTION OF THE PREFERRED EMBODIMENTS

Figure 1:
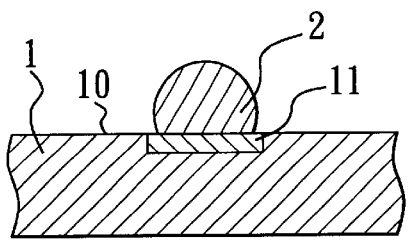
FIG. 1 is a schematic view to illustrate a conductive first bump formed on a semiconductor chip, which is to be mounted on a substrate according to this invention.

FIG. 1 illustrates a semiconductor chip 1 to be mounted on a substrate 6 (see FIG. 7), such as a printed circuit board or another semiconductor device, according to the method of this invention. The substrate 6 has a chip-mounting region provided with a plurality of solder points 61 (only one solder point 61 is shown). The semiconductor chip 1 has a pad-mounting surface 10 provided with a plurality of bonding pads 11 (only one bonding pad 11 is shown), which are to be connected to corresponding ones of the solder points 61 and which are disposed on the pad-mounting surface 10 at locations that may be registered with or that may be offset from locations of the corresponding ones of the solder points 61 on the chip-mounting region of the substrate 6.

FIGS. 1 to 6 illustrate consecutive steps of processing the semiconductor chip 1 for forming a semiconductor device that is to be mounted on the substrate 6 according to this invention.

In FIG. 1, a plurality of conductive first bumps 2 (only one first bump 2 is shown) are respectively formed on and protrude from the bonding pads 11 on the pad-mounting surface 10 of the semiconductor chip 1 via known soldering techniques.

Figure 2:
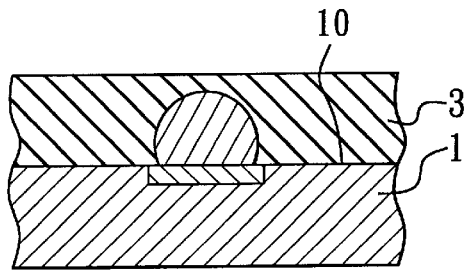
FIG. 2 a schematic view to illustrate a photoresist layer formed on a pad-mounting surface of the semiconductor chip of FIG. 1 according to this invention.

In FIG. 2, a light-curable layer, such as a photoresist layer 3, is formed on the pad-mounting surface 10 such that the first bumps 2 are embedded in the photoresist layer 3.

Figure 3:
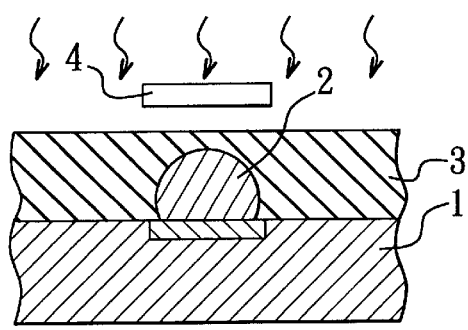
FIG. 3 is a schematic view to illustrate a mask used in a photolithography process for the photoresist layer of FIG. 2 according to this invention.

In FIG. 3, a mask 4 is superimposed on the phtoresist layer 3, and the photoresist layer 3 is exposed at positions that are offset from the first bumps 2 and the bonding pads 11. The exposed portions of the photoresist layer 3 harden, and form an insulative isolating layer that covers the pad-mounting surface 10.

Figure 4:
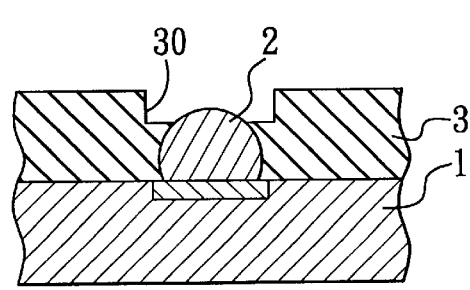
FIG. 4 is a schematic view to illustrate an access hole formed in the photoresist layer of FIG. 3 according to this invention.

In FIG. 4, a plurality of access holes 30 (only one is shown) are formed in the photoresist layer 3 by removing the unexposed portions of the photoresist layer 3 from the isolating layer via solvent washing. Each of the access holes 30 exposes a portion of a respective one of the first bumps 2. In this embodiment, each access hole 30 extends from the upper surface of the photoresist layer 3 to a level that is above the pad-mounting surface 10 and that is below a top portion of the respective first bump 2. The depth of each access hole 30 can be manipulated by controlling the washing time during the process of solvent washing.

Figure 5:
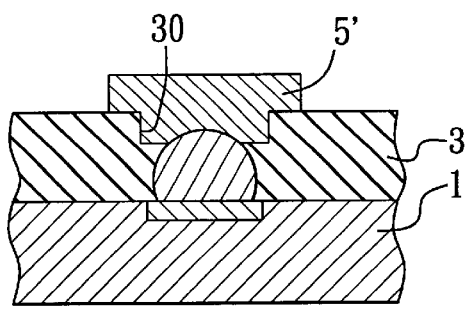
FIGS. 5 and 6 are schematic views to illustrate formation of a second bump on top of the first bump in the access hole of FIG. 4 according to this invention.
Figure 6:
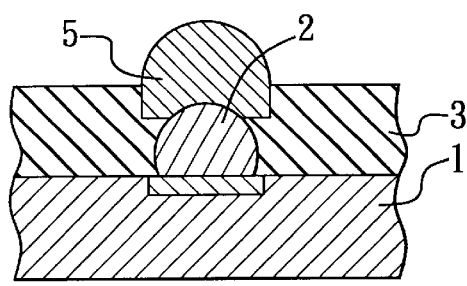

FIGS. 5 and 6 illustrate the steps of formation of a conductive second bump 5 on top of the first bump 2 in each access hole 30 of FIG. 4. In FIG. 5, a lump of a conductive metal paste 5' is filled into each of the access holes 30, with a top portion of the lump of the metal paste 5' protruding from an upper surface of the photoresist layer 3. The lump of the metal paste 5' is heated with infrared rays so as to be substantially melted, and is subsequently cooled in order to form the second bump 5 which has a lower portion that fills the respective access hole 30 and that encapsulates the exposed portion of the respective first bump 2, and an upper portion protruding from the upper surface of the photoresist layer 3. The remaining portion of each first bump 2 is embedded in the photoresist layer 3.

Figure 7:
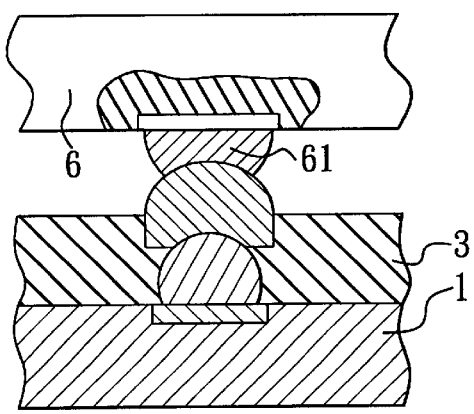
FIG. 7 is a schematic view to illustrate connection of the second bump of FIG. 6 with the substrate.
Figure 8:
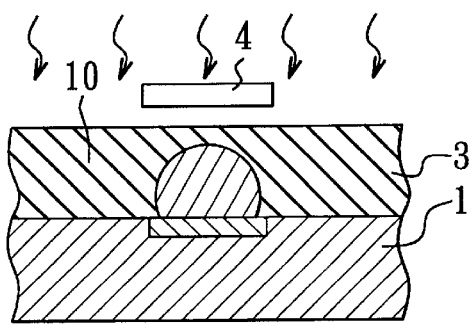
FIGS. 8 and 9 are schematic views to illustrate how a modified access hole is formed in the photoresist layer of FIG. 4 according to this invention.

As shown in FIG. 7, with the formation of the second bumps 5, the connection of the bonding pads 11 with the respective solder points 61 on the substrate 6 can be facilitated, and the processing difficulty as encountered in the prior art can be overcome.

Figure 15:
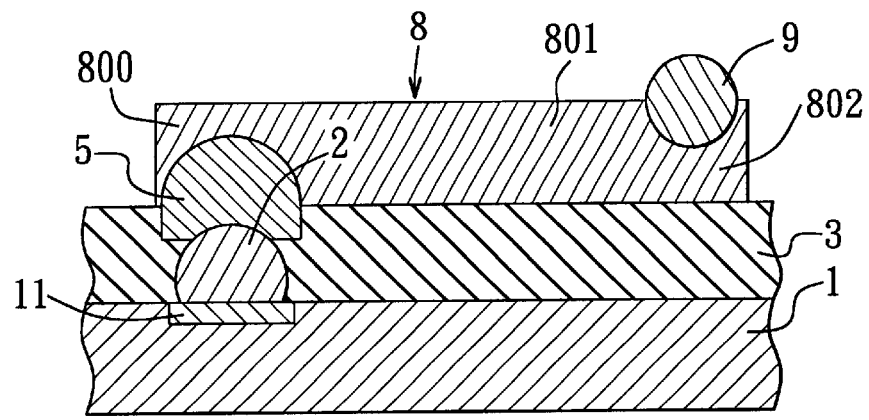
FIG. 15 is a schematic view to illustrate formation of a conductive body on the photoresist layer of FIG. 6.

FIG. 15 corresponds to FIG. 7, but instead of being registered with the respective solder point 61, each bonding pad 11 is located at a position that is offset from the location of the respective solder point (not shown). As such, the semiconductor device further includes a plurality of conductive bodies 8 (only one is shown) that are subsequently formed after the second bumps 5 are formed. Each of the conductive bodies 8 has an extension portion 801, and an anchor portion 800 and a contact portion 802 on opposite ends of the extension portion 801. The anchor portion 800 connects electrically with and encapsulates the upper portion of a respective one of the second bumps 5. The contact portion 802 is formed on the upper surface of the photoresist layer 3, and is disposed at the location corresponding to the respective one of the solder points on the chip-mounting region of the substrate. The extension portion 801 is formed on the upper surface of the photoresist layer 3, and interconnects the anchor and contact portions 800, 802. A third bump 9 is subsequently formed on and protrudes from the contact portion 802 of each conductive body 8 in a transverse direction relative to the respective extension portion 801 via known soldering techniques after formation of the conductive bodies 8, and is registered with the respective one of the solder points on the chip-mounting region of the substrate.

Figure 18:
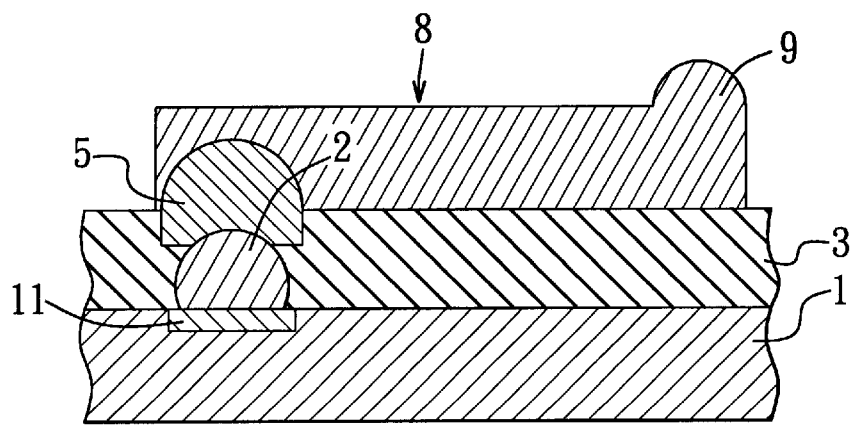
FIG. 18 is a schematic view to illustrate formation of a modified conductive body on the photoresist layer of FIG. 15.

Alternatively, as shown in FIG. 18, the third bump 9 can be integrally formed with the anchor and extension portions 800, 801.

FIGS. 8 to 11 correspond to FIGS. 3 to 6 to illustrate consecutive steps of formation of a plurality of modified access holes 30 (only one is shown) in the photoresist layer 3 of FIG. 4 and formation of a plurality of modified second bumps 5 (only one is shown) in the modified access holes 30 according to this invention. Each of the modified access holes 30 has a depth from the upper surface of the photoresist layer 3 to the pad-mounting surface 10 of the semiconductor chip 1 so that each modified second bump 5 covers the entire upper surface of the respective first bump 2.

Figure 11:
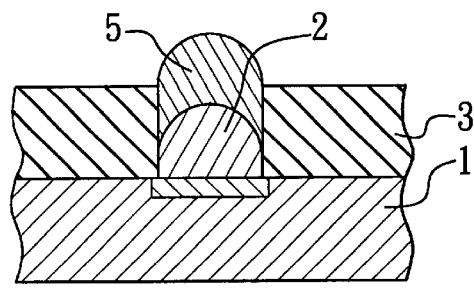
FIGS. 10 and 11 are schematic views to illustrate formation of a modified second bump of FIG. 6 in the modified access hole of FIG, 9.
Figure 9:
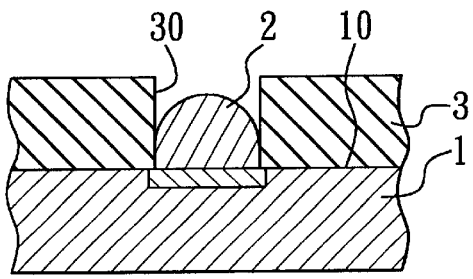
Figure 16:
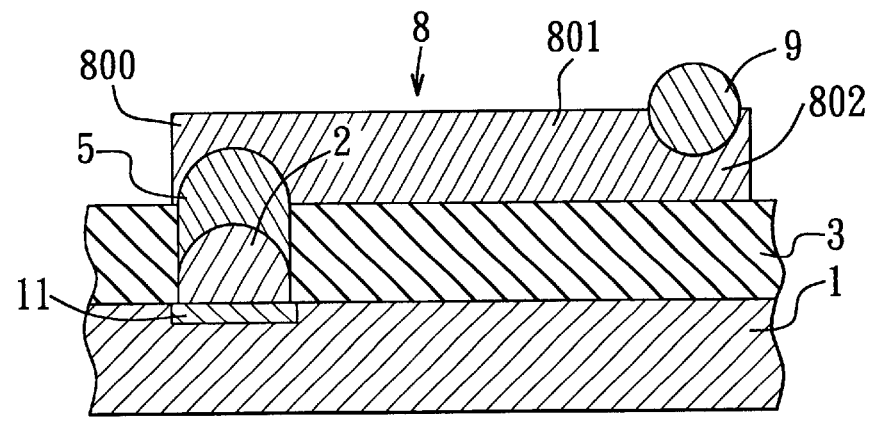
FIG. 16 is a schematic view to illustrate formation of a conductive body on the photoresist layer of FIG. 11.

FIG. 16 corresponds to FIG. 15 to illustrate formation of the conductive bodies 8 on the photoresist layer 3 after formation of the second bumps 5 of FIG. 11, with the third bumps 9 formed on the conductive bodies 8 via known soldering techniques after formation of the conductive bodies 8.

Figure 19:
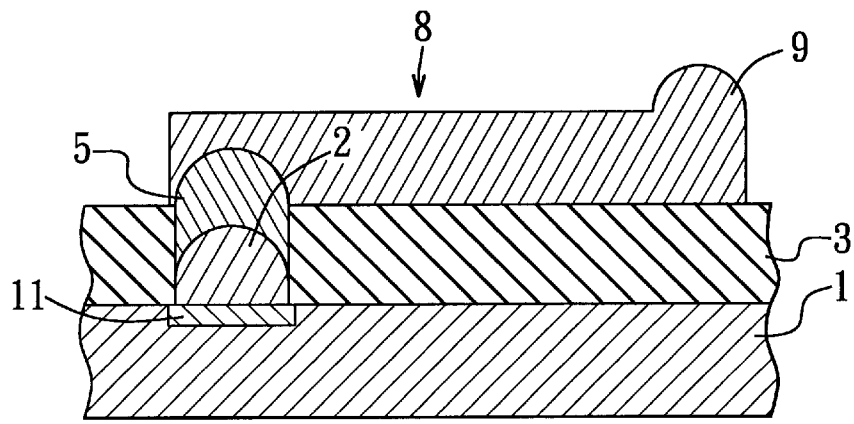
FIG. 19 is a schematic view to illustrate formation of a modified conductive body on the photoresist layer of FIG. 16.

FIG. 19 corresponds to FIG. 18 to illustrate alternative formation of the third bump 9 which is integrally formed with the anchor and extension portions 800, 801 of the conductive body 8 of FIG. 16.

Figure 12:
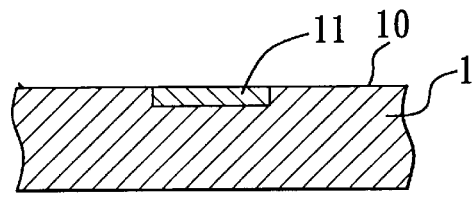
FIGS. 12 to 14 are schematic views to illustrate formation of an access hole in a photoresist layer on a pad-mounting surface of a semiconductor chip and formation of a plating layer in the access hole according to another embodiment of this invention.
Figure 10:
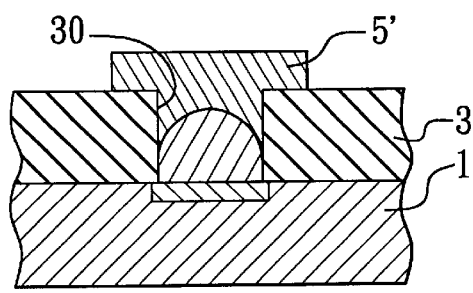
Figure 13:
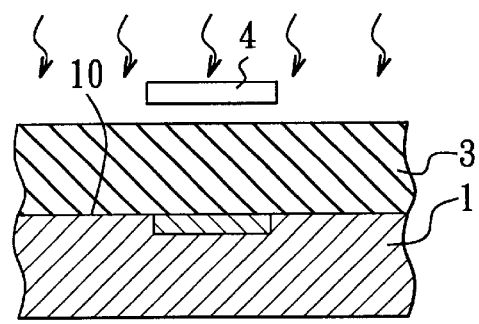
Figure 14:
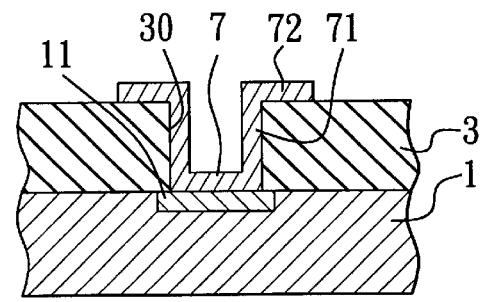

FIGS. 12 to 14 illustrate consecutive steps for processing the semiconductor chip 1 to form a modified semiconductor device based on this invention. The formation of each access hole 30 in this method is similar to that of the previous method. However, instead of forming the first and second bumps 2, 5, a plating layer 7 is formed in a respective access hole 30 via known plating techniques. Each plating layer 7 has a tubular lower portion 71 that lines a peripheral wall of the respective one of the access holes 30 and that is electrically connected to a respective one of the bonding pads 11, and an upper portion 72 extending from the lower portion 71 and lying on the upper surface of the photoresist layer 3 around the respective one of the access holes 30.

Figure 17:
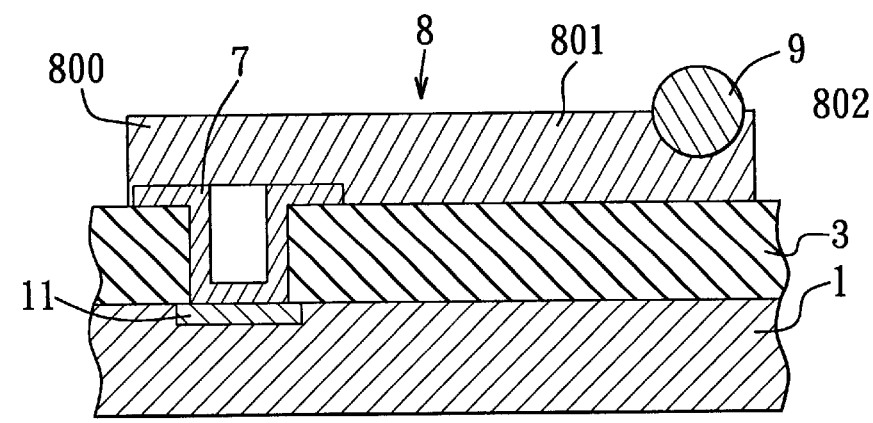
FIG. 17 is a schematic view to illustrate formation of a conductive body on the photoresist layer of FIG. 14.

FIG. 17 corresponds to FIG. 15 or FIG. 16 to illustrate formation of the conductive bodies 8 on the photoresist layer 3 of FIG. 14 after formation of the plating layers 7, with the third bumps 9 formed on the conductive bodies 8 via known soldering techniques after formation of the conductive bodies 8. The anchor portion 800 of each conductive body 8 fills an interior of the lower portion 71 of the respective one of the plating layers 7, and encapsulates the upper portion 72 of the respective one of the plating layers 7 so as to connect electrically with the respective bonding pad 11.

Figure 20:
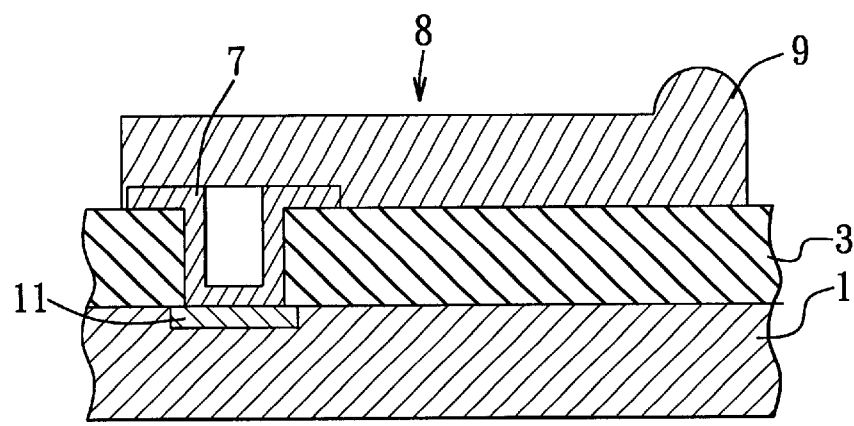
FIG. 20 is a schematic view to illustrate formation of a modified conductive body on the photoresist layer of FIG. 17.

FIG. 20 corresponds to FIG. 18 or FIG. 19 to illustrate alternative formation of the third bump 9 which is integrally formed with the anchor and extension portions 800, 801 of the conductive body 8 of FIG. 17.

The first bumps 2 are preferably formed from tin solder, whereas the second bumps 5 and the conductive bodies 8 are formed from conductive paste that contains a metal selected from a group consisting of gold, silver, copper, iron, tin, and aluminum.

With the second bumps 5 or the plating layers 7, the conductive bodies 8 can be firmly held in contact with the bonding pads 11 without peeling off during the subsequent processing steps, such as thermal test.

With the invention thus explained, it is apparent that various modifications and variations can be made without departing from the spirit of the present invention. It is therefore intended that the invention be limited only as recited in the appended claims.

I claim:

1. A semiconductor device adapted for mounting on a substrate, the substrate having a chip-mounting region provided with a plurality of solder points, said semiconductor device comprising:

a semiconductor chip having a pad-mounting surface provided with a plurality of bonding pads which are disposed on said pad-mounting surface;

a plurality of conductive first bumps electrically and respectively connected to and protruding from said bonding pads;

a photoresist layer formed on said pad-mounting surface of said semiconductor chip, said photoresist layer being formed with a plurality of access holes registered with and exposing at least a portion of a respective one of said first bumps on said bonding pads; and a plurality of conductive second bumps, each of which has a lower portion filling a respective one of said access holes to electrically connect with and encapsulate said portion of a respective one of said first bumps, and an upper portion extending from said lower portion and protruding from an upper surface of said photoresist layer opposite to said pad-mounting surface.

2. The semiconductor device of claim 1, further comprising a plurality of conductive bodies, each of which has an extension portion, and an anchor portion and a contact portion on opposite ends of said extension portion, said anchor portion filling a respective one of said access holes and connecting electrically with and encapsulating said upper portion of a respective one of said second bumps, said contact portion being formed on said upper surface of said photoresist layer and being disposed at the location corresponding to a respective one of the solder points on the chip-mounting region of the substrate, said extension portion being formed on said upper surface of said photoresist layer and interconnecting said anchor and contact portions.

3. The semiconductor device of claim 1, wherein each of said access holes has a depth from said upper surface of said photoresist layer to said pad-mounting surface of said semiconductor chip.

4. The semiconductor device of claim 1, wherein each of said access holes has a depth from said upper surface of said photoresist layer to a level above the respective one of said bonding pads and below a top portion of the respective one of said first bumps.

5. The semiconductor device of claim 2, wherein said contact portion of each of said conductive bodies is formed with a conductive third bump that protrudes therefrom in a transverse direction relative to said extension portion, and is integrally formed with said anchor and extension portions.

6. The semiconductor device of claim 2, further comprising a conductive third bump formed on said contact portion of each of said conductive bodies such that said third bump protrudes from said contact portion in a transverse direction relative to said extension portion.

7. The semiconductor device of claim 2, wherein said first bumps are made of tin solder, and said second bumps and said conductive bodies are made of a conductive metal paste that contains a metal selected from a group consisting of gold, silver, copper, iron, tin, and aluminum.

8. A semiconductor device adapted for mounting on a substrate, the substrate having a chip-mounting region provided with a plurality of solder points, said semiconductor device comprising:

a semiconductor chip having a pad-mounting surface provided with a plurality of bonding pads;

a photoresist layer formed on said pad-mounting surface of said semiconductor chip, said photoresist layer being formed with a plurality of access holes registered with and exposing at least a portion of a respective one of said bonding pads, each of said access holes being confined by a peripheral wall;

a plurality of plating layers, each of which has a tubular lower portion that lines said peripheral wall of a respective one of said access holes and that is electrically connected to a respective one of said bonding pads, and an upper portion that lies on an upper surface of said photoresist layer around the respective one of said access holes; and a plurality of conductive bodies, each of which has an extension portion, and an anchor portion and a contact portion on opposite ends of the extension portion, said anchor portion filling an interior of said lower portion of a respective one of said plating layers, and encapsulating said upper portion of the respective one of said plating layers so as to electrically connect with the respective one of said bonding pads, said contact portion being formed on said upper surface of said photoresist layer and being disposed at the location corresponding to a respective one of the solder points on the chip-mounting region of the substrate, said extension portion being formed on said upper surface of said photoresist layer and interconnecting said anchor and contact portions.

9. The semiconductor device of claim 8, wherein said contact portion of each of said conductive bodies is formed with a conductive bump that protrudes therefrom in a transverse direction relative to said extension portion, and is integrally formed with said anchor and extension portions.

10. The semiconductor device of claim 8, further comprising a conductive bump formed on said contact portion of each of said conductive bodies such that said bump protrudes from said contact portion in a transverse direction relative to said extension portion.

11. The semiconductor device of claim 10, wherein said bump is made of tin solder, and said conductive bodies are made of a conductive metal paste that contains a metal selected from a group consisting of gold, silver, copper, iron, tin, and aluminum.

* * * * *